US012740215B2

(12) United States Patent
Shen et al.

(10) Patent No.: US 12,740,215 B2
(45) Date of Patent: Sep. 15, 2026

(54) INTEGRATED PHOTODIODE MANUFACTURING METHOD, A PHOTODIODE, AND A PHOTOELECTRIC KEYBOARD

(71) Applicants: Wei Shen, Shenzhen (CN); Ke Chen, Shenzhen (CN)

(72) Inventors: Wei Shen, Shenzhen (CN); Ke Chen, Shenzhen (CN)

(73) Assignee: Shenzhen Huasheng Optoelectronics Co., Ltd., Shenzhen (CN)

( * ) Notice: Subject to any disclaimer, the term of this patent is extended or adjusted under 35 U.S.C. 154(b) by 374 days.

(21) Appl. No.: 18/541,504

(22) Filed: Dec. 15, 2023

(65) Prior Publication Data

US 2025/0201788 A1 Jun. 19, 2025

(51) Int. Cl.
*H10H 29/01* (2025.01)

(52) U.S. Cl.
CPC ...... *H10H 29/011* (2025.01); *H10H 29/0361* (2025.01); *H10H 29/0362* (2025.01)

(58) Field of Classification Search
CPC ............. H10H 29/011; H10H 29/0361; H10H 29/0362
See application file for complete search history.

(56) References Cited

U.S. PATENT DOCUMENTS 4,694,723 A * 9/1987 Shinohara .............. G09B 15/04 84/478
2004/0089898 A1* 5/2004 Ruhnau .............. H10H 20/8506 257/343
2009/0001393 A1* 1/2009 Seo ........................ H10W 90/00 257/89
2009/0159914 A1* 6/2009 Zhan .................. H10H 20/8511 257/98
2013/0063020 A1* 3/2013 Daicho ................. H10W 90/00 313/502
2022/0181529 A1* 6/2022 Hsieh ................... H10H 20/856

* cited by examiner

*Primary Examiner* — Peter M Albrecht

(57) ABSTRACT

The present invention discloses an integrated photodiode manufacturing method, a photodiode, and a photoelectric keyboard; the said method comprises the provision of a parallel support, and there is a plurality of pins on the said parallel support; on the parallel support, the infrared light chip and the visible light chip are fixed and installed; the electrodes of the said infrared chip and the said visible light chip are connected to the corresponding said pins respectively to form the electrical circuits independently with each other; the said infrared light chip and the said visible light chip are packaged with the packaging adhesive and/or the fluorescent adhesive to form the photodiode. The said packaging adhesive is transparent or translucent adhesive, and the said fluorescent adhesive is photoluminescence fluorescent material adaptable to the color of the said visible light chip; the packaged photodiode is baked and cured to form the photodiode integrating infrared light and visible light. By the present method, a kind of photodiode emitting infrared light and visible light simultaneously can be manufactured. In application, the present integrated photodiode can reduce the amount of components and reduce the cost.

2 Claims, 2 Drawing Sheets

INTEGRATED PHOTODIODE MANUFACTURING METHOD, A PHOTODIODE, AND A PHOTOELECTRIC KEYBOARD

FIELD OF INVENTION

The present invention relates to the technical field of photodiode manufacturing and packaging, in particular to a manufacturing method for integrated photodiode, a photodiode, and a photoelectric keyboard.

BACKGROUND OF INVENTION

With the continuous development of science and technology, photodiode as a new-generation light source has been deeply involved in the people's work and life and used widely in the field of scientific research, and also plays an important role in daily life and industrial production. Among others, as an important field, the photoelectric keyboard application requires the photodiode to have the function of decoration, lighting, and light signal transmission. However, the existing light-emitting diodes and the infrared light diodes are packaged individually, and have only a single photoelectric characteristic, so that in the photoelectric keyboard applications, if the functions of photoelectric lighting and light signal transmission are required, two different photoelectric components shall be used.

This not only affects the design of the circuit, but also increases the difficulty in design of the small size circuit board, and also increases the cost of product application. First, the design of circuit will become more complex due to the use of two different optoelectronic components. Any component needs its specific drive and control circuit, requiring more complex layout and design in a limited space, so as to put forward higher requirements for the designer's technology and innovation capacity. Moreover, in design of the circuit, consideration shall also be given to current, voltage, power consumption and other parameters of different components, in order to ensure the stable and safe operation of the entire system. Second, the use of two different optoelectronic components will lead to the increased cost of product applications. Each component requires a independent manufacturing and procurement process, resulting in the increased cost of raw materials and production. Furthermore, because more components are used, more time and manpower are spent during the process of assembly, commissioning and maintenance, also resulting in the increased the total cost of the product.

Therefore, how to simplify the design of circuit and reduce the cost of product application while maintaining the decoration, lighting and optical signal transmission functions of photodiode has become an important subject nowadays.

CONTENTS OF INVENTION

The present invention is intended to solve, at least to a certain extent, one of the technical problems in the related technology. To this end, the present invention aims to provide a manufacturing method for integrated photodiode, a photodiode and a photoelectric keyboard.

To achieve the aforesaid purposes, in the first aspect, a manufacturing method for integrated photodiode according to the embodiment of the present invention comprises:

A parallel support is provided, and there is a plurality of pins on the said parallel support;

On the parallel support, the infrared light chip and the visible light chip are fixed and installed;

The electrodes of the said infrared chip and the said visible light chip are connected to the corresponding said pins respectively to form the electrical circuits independently with each other;

The said infrared light chip and the said visible light chip are packaged with the packaging adhesive and/or the fluorescent adhesive to form the photodiode. The said packaging adhesive is transparent or translucent adhesive, and the said fluorescent adhesive is photoluminescence fluorescent material adaptable to the color of the said visible light chip;

The packaged photodiode is baked and cured to form the photodiode integrating infrared light and visible light.

According to one embodiment of the present invention, the said infrared light chip and the said visible light chip fixed on the parallel support comprise:

The fixing adhesive is dispensed at the predetermined position on the parallel support or the pin;

The said infrared light chip and the said visible light chip are placed in the corresponding predetermined position respectively and in contact with the fixing adhesive so as to form the preassembled part;

The said preassembled part is baked and cured so that the said infrared light chip and the said visible light chip are fixed on the said parallel support or the pin after the fixing adhesive is cured.

According to one embodiment of the present invention, the said preassembled part is baked at the temperature of 150~180° C., and for 60~80 minutes.

According to one embodiment of the present invention, the said photodiode is of the light-emitting structure integrating infrared light and monochromatic light, or the said photodiode is of the light-emitting structure integrating infrared light and red, green and blue magic light;

The process that the said infrared light chip and the said visible light chip are packaged with the packaging adhesive and/or the fluorescent adhesive to form the photodiode is particularized in that the said infrared light chip and the said visible light chip packaged by dispensing transparent or translucent adhesive.

According to one embodiment of the present invention, the said photodiode is of the light-emitting structure integrating infrared light and white light The process that the said infrared light chip and the said visible light chip are packaged with the packaging adhesive and/or the fluorescent adhesive to form the photodiode is particularized in that the said infrared light chip is packaged by dispensing transparent or translucent adhesive, and the said visible light chip is packaged by dispensing white light fluorescent adhesive.

According to one embodiment of the present invention, the said photodiode is of the light-emitting structure integrating infrared light and composite color light The process that the said infrared light chip and the said visible light chip are packaged with the packaging adhesive and/or the fluorescent adhesive to form the photodiode is particularized in that the said infrared light chip is packaged by dispensing transparent or translucent adhesive, and the said visible light chip is packaged by dispensing composite color light fluorescent adhesive.

According to one embodiment of the present invention, the said photodiode is of the light-emitting structure integrating infrared light and white light of composite color light;

The process that the said infrared light chip and the said visible light chip are packaged with the packaging adhesive and/or the fluorescent adhesive to form the photodiode is particularized in that the said infrared light chip and the said visible light chip are packaged by dispensing white light fluorescent adhesive or composite color light fluorescent adhesive According to one embodiment of the present invention, the process that the packaged photodiode is baked and cured is particularized in:

The packaged photodiode is baked in the first stage, the baking temperature in the said first stage is 60~100° C., and the baking time is 60~80 minutes;

The packaged photodiode is baked in the second stage, the baking temperature in the said second stage is 140~160° C., and the baking time is 60~80 minutes;

In the second aspect, the embodiment of the present invention provides an integrated photodiode, which is manufactured by the method described above.

In the third aspect, the embodiment of the present invention provides a photoelectric keyboard, and each said LED key module has the integrated photodiode as described above.

According to the manufacturing method for integrated photodiode, the photodiode and the photoelectric keyboard provided in the embodiment of the present invention, the infrared light chip and the visible light chip are integrated and fixed on the parallel support, and packaged by dispensing packaging adhesive and/or fluorescent adhesive after the wires are welded, and then cured by baking, so as to manufacture a kind of photodiode that can emit infrared light and visible light simultaneously. When the integrated photodiode is applied in the photoelectric keyboard, it can realize the functions of photoelectric lighting and optical signal transmission at the same time, so as to reduce the amount of components used effectively, reduce the design size of the circuit board, reduce the difficulty of the process in the finished product application, save the production cost, while achieving the mass production. In addition, the integrated photodiode in the present invention has the advantages of low power consumption, good stability, safety, environmental protection, energy saving, and is harmless to human body.

Some additional aspects and advantages of the present invention will be given in the Description below, and some additional aspects and advantages will become apparent from the Description below, or will be learned through the practice of the present invention.

BRIEF INTRODUCTION OF APPENDED DRAWINGS

In order to make a clearer explanation to the technical scheme in the embodiments of the present invention or in the prior art, the appended drawings to be used in the embodiments or description of the prior art are briefly introduced below. It is obvious that the appended drawings described below are only certain embodiments recorded in the present invention, and the ordinary persons skilled in the art can also obtain other appended drawings on the basis of the structures shown in such appended drawings without the contribution of creative labor.

Figure 1:
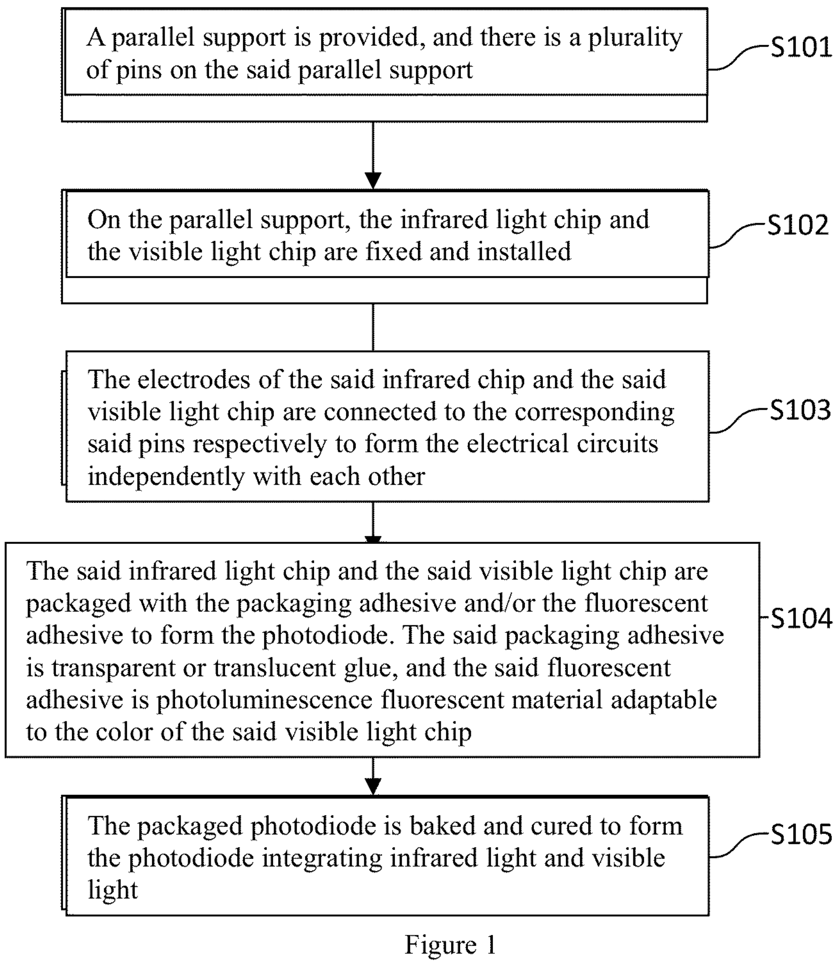
FIG. 1 is the flow chart for embodiment of the manufacturing method for the integrated photodiode in the present invention.

The realization of the purpose, the functional characteristics and advantages of the present invention will be further explained in conjunction with the embodiments and with reference to the appended drawings.

SPECIFIC IMPLEMENTATION MODE

The embodiments of the present invention are described in detail below, the examples of the said embodiments are shown in the appended drawings, where identical or similar labels are used to indicate the identical or similar components or the components with identical or similar functions from beginning to end. The embodiments described below with reference to the appended drawings are exemplary and intended to interpret the present invention, and shall not be construed as the limitations on the present invention. Based on the embodiments of the present invention, all other embodiments obtained by ordinary skilled persons in the art without contribution of creative labor shall fall within the protection scope of the present invention.

In the description of the present invention, it shall be understood that the oriental and positional relationship indicated by the terms such as "center", "longitudinal", "transverse", "length", "width", "thickness", "up", "down", "front", "rear", "left", "right", "vertical", "horizontal", "top", "bottom", "inside", "outside", "clockwise", "counterclockwise", "axial", "circumferential", and "radial" are based on the oriental and positional relationship indicated in the appended drawings, and for description of the present invention and simplification of the description only, but not intended to indicate or imply that the device or component referred to must have a particular orientation, and must be constructed and operated in a particular orientation; therefore such oriental and positional relationship shall not be interpreted as the limitation on the present invention.

In addition, the terms "first" and "second" shall be used for descriptive purpose only, and shall not be understood to indicate or imply relative importance or to indicate implicitly the quantity of the technical features as indicated. Thus, a feature defined as "first" or "second" may include, explicitly or implicitly, one or more such features. In the description of the present invention. "multiple" means two or more unless otherwise expressly defined.

In the present invention, unless otherwise expressly specified and defined, the terms "installation", "association", "connection", and "fixing", shall be understood in a broad sense; for example, it includes fixed connection, or detachable connection, or integrated connection; mechanical connection, or electrical connection; direct connection, or indirect connection through an intermediate medium, or connection within two components. For ordinary skilled persons in the art, the specific meaning of the above terms in the present invention can be understood according to the specific circumstances.

In the present invention, unless otherwise expressly specified and defined, the first feature may include direct contact between the first and second features "above" or "under" the second features, or may include contact between the first and second features not directly but through another feature between them. Furthermore, the first feature "above", "over" and "on" the second feature include the first feature being directly above and diagonally above the second feature, or simply indicating that the first feature is higher in level than the second feature. The first feature "under", "below" and "underneath" the second feature include the first feature being directly below and diagonally below the second feature, or simply indicating that the first feature is lower in level than the second feature.

The manufacturing method for integrated photodiode, the photodiode and the photoelectric keyboard in the embodiments of the present invention are described in detail bellow with reference to the appended drawings.

Figure 2:
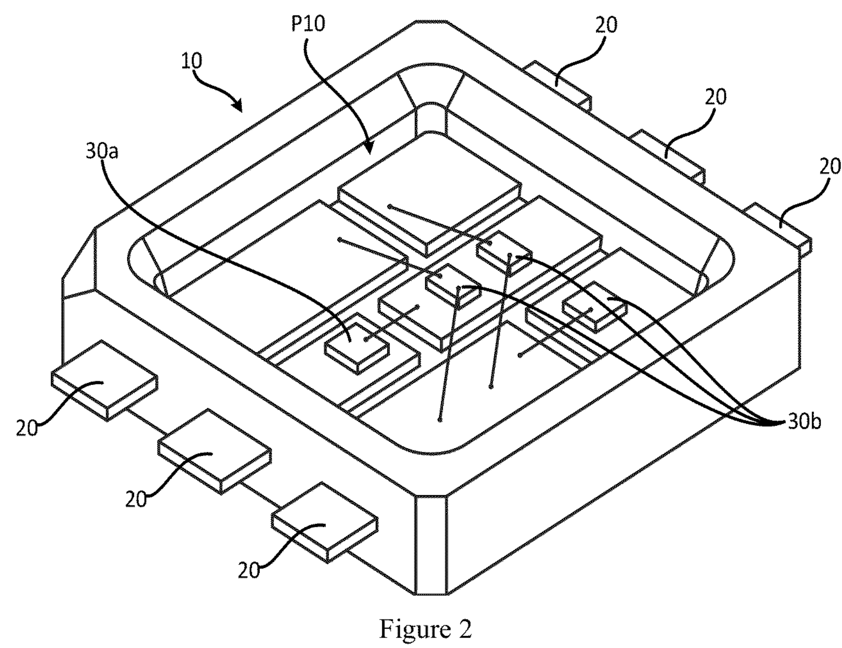
FIG. 2 is the stereogram for an embodiment of the integrated photodiode in the present invention.
Figure 3:
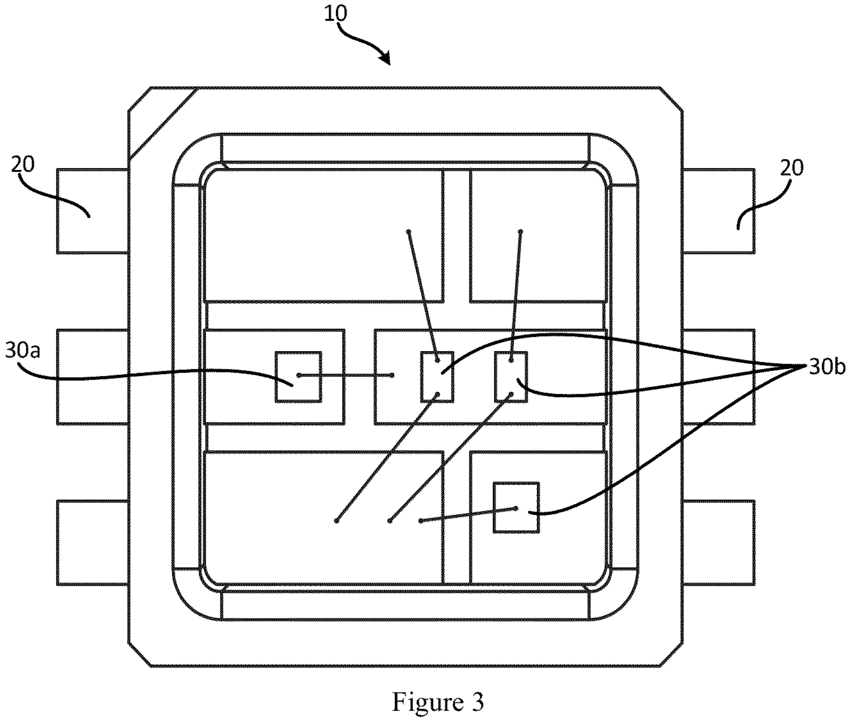
FIG. 3 is the top view for an embodiment of the integrated photodiode in the present invention.

As shown in FIGS. 1 to 3, the manufacturing method for integrated photodiode provided according to the embodiments of the presented invention comprises the following steps:

S101. A parallel support 10 is provided, and there is a plurality of pins 20 on the said parallel support 10.

The parallel support 10 can be made of plastic material with sufficient stability and mechanical strength. The shape and size of the parallel support 10 can be designed and manufactured according to the specific application requirements.

Exemplarily, the parallel support 10 is formed into a rectangular support, and there is a sealing cavity P10 in the middle of the rectangular support, a plurality of pins 20 are formed on the rectangular support by means of injection molding, and one end of pin 20 extends into the scaling cavity P10, the position of which shall match the electrode position of the infrared light chip and the visible light chip in the subsequent steps, so that the correct electrical circuit can be formed when the electrodes are connected. The other end of pin 20 is located on the outside of the rectangular support to facilitate connection in the applied circuit in the specific application.

It should be noted that in step S101, the number of pin 20 can vary according to the specific design requirements and application requirements, mainly depending on the functions and characteristics of the photodiode. For example, in a photodiode integrating an infrared light chip and a visible light chip, there are usually four pins 20, of which two pins 20 are used to connect to the positive and negative electrodes of the infrared light chip, and the other two pins 20 are used to connect to the positive and negative electrodes of the visible light chip. By this way, it is possible to ensure that the infrared light and the visible light have independent electrical circuits to control and drive them separately.

S102. The infrared light chip 30*a* and the visible light chip 30*b* are fixed and installed on the parallel support 10.

Specifically, the infrared light chip 30*a* and the visible light chip 30*b* shall be prepared in advance, the infrared light chip 30*a* is used to emit infrared light, and the visible light chip 30*b* is used to emit visible light; exemplarily, the common visible light chip 30*b* may be blue chip, red chip, green chip and so on. Then select a suitable position on the parallel support 10, and fix and install the infrared light chip 30*a* and the visible light chip 30*b*, for example, by pasting or other appropriate fixing methods. Preferably, the chip shall be installed on the pin 20 in the sealing cavity P10, in order to ensure the reliable fixation between the chip and the pin 20. By this installation method, it is possible to ensure the reliable electrical connection between the electrode of the chip and the pin 20 in the subsequent steps.

S103. The electrodes of the said infrared light chip 30*a* and the visible light chip 30*b* are connected to the corresponding pins 20 respectively to form the electrical circuits independently with each other.

Each pin 20 can be connected to the corresponding electrode of the infrared light chip 30*a* and the visible light chip 30*b*. By connecting the pin 20 with the electrode, the electrical connection of the infrared light chip 30*a* and the visible light chip 30*b* can be realized to form the electrical circuits independently with each other. When an electric current passes through such electrodes, the photodiode will emit the infrared light and the visible light.

Specifically, first, the material for connection of the electrodes shall be prepared. Common electrode connection materials include metal wire (e.g. gold wire or copper wire). On the infrared light chip 30*a* and the visible light chip 30*b*, the positions of electrodes shall be determined, and shall be consistent with the positions of the pins 20 on the parallel support 10. Next, the electrodes are extended to the pins 20 on the parallel support 10 with gold wire or other suitable conductor materials and then welded to ensure the proper connection between the electrodes of the chips and the pins 20, so as to achieve transmission of signal. Finally, after the connection of electrodes is completed, the necessary electrical tests can be conducted to ensure that the electrical circuits of the infrared light chip 30*a* and the visible light chip 30*b* are connected correctly.

S104. The infrared light chip 30*a* and the visible light chip 30*b* are packaged with the packaging adhesive and/or the fluorescent adhesive to form the photodiode. The said packaging adhesive is transparent or translucent adhesive, and the said fluorescent adhesive is photoluminescence fluorescent material adaptable to the color of the said visible light chip 30*b*.

In the step S104, the packaging material is usually a material with good insulating properties and protective properties, such as epoxy resin or silica gel, which is transparent or translucent. These materials can provide physical protection for the photodiode and prevent external factors such as dust and moisture from affecting the chip. In addition, the packaging material may be the photoluminescence fluorescent adhesive. The fluorescent material is a special kind of material that can absorb the incident light and emit the light with longer wavelength within a short time. This phenomenon is called the fluorescence effect. The fluorescence effect of the fluorescent material is realized through the process of excitation and recombination.

When the fluorescent material is excited by the incident light with higher energy, the electrons in the material will transition to a higher energy level. This excited state is unstable, so the electrons quickly return to a lower energy level, releasing energy. Such energy is emitted in the form of photons, producing fluorescent light. The fluorescence color of the fluorescent material is determined by its molecular structure and the chemical composition. By adjusting the chemical composition and the molecular structure of the material, the fluorescence emission of different colors can be achieved. For example, the fluorescent material can emit a variety of colors in the range of visible light, such as blue, green, red, etc.

It should be noted that the use of packaging adhesive or fluorescent adhesive in this step mainly depends on the integrated functional requirements of the photodiode, and the corresponding packaging adhesive or fluorescent adhesive is used to package the infrared light chip 30*a* and the visible light chip 30*b* for different light emitting requirements. In addition, in this step, the packaging adhesive or the fluorescent adhesive can be dispensed on the chips to which the electrodes are connected by the packaging dispensing process.

S105. The packaged photodiode is baked and cured to form a photodiode integrating the infrared light and the visible light.

The purpose of this step is to reinforce the packaging adhesive and the fluorescent adhesive, in order to ensure that they can be firmly bonded to the infrared light chip 30*a* and the visible light chip 30*b*, so as to improve the structural stability and durability of the photodiode.

Baking and curing are carried out by placing the packaged photodiode in special baking equipment. The baking equipment usually provides controllable temperature and time parameters to ensure that the packaging adhesive and the fluorescent adhesive can achieve the appropriate degree of curing.

During the process of baking, the photodiode is exposed to a certain temperature, which is helpful to the rapid curing of the packaging adhesive and the fluorescent adhesive. By curing, the packaging adhesive can firmly bond the photoelectric components, protect them from the external environment, and provide mechanical support. The fluorescent adhesive can also be cured to enhance light emitting effect of the visible light. The temperature and time parameters during the process of baking shall be adjusted according to the specific materials of packaging adhesive and fluorescent adhesive, so as to ensure the curing effect.

After this step is completed, the baking and curing process of the photodiode is completed, so the packaging is completed, resulting in the product with stable packaging and curing adhesive layer. After the packaging is completed, the necessary package tests can be conducted to verify the packaging quality and performance of the photodiode. Through such tests, it is possible to ensure that the packaged photodiode shall conform to the specifications, have reliable performance, emit both infrared light and visible light, and have high structural strength and durability.

By the manufacturing method for the integrated photodiode provided in the embodiments of the present invention, the infrared light chip 30*a* and the visible light chip 30*b* are integrated and fixed on the parallel support 10, and packaged by dispensing the packaging adhesive and/or the fluorescent adhesive after the wires are welded. Then, the photodiode that can emit infrared light and visible light simultaneously is manufactured by means of baking and curing. When the integrated photodiode is applied in the photoelectric keyboard, it can realize the functions of photoelectric lighting and optical signal transmission at the same time, so as to reduce the amount of components used effectively, reduce the design size of the circuit board, reduce the difficulty of the process in the finished product application, save the production cost, while achieving the mass production. In addition, the integrated photodiode in the present invention has the advantages of low power consumption, good stability, safety, environmental protection, energy saving, and is harmless to human body.

In one embodiment of the present invention, in the above step S102, the infrared light chip 30*a* and the visible light chip 30*b* are fixed on the parallel support, comprising:

The fixing adhesive is dispensed at the predetermined position on the parallel support 10 or the pin 20.

The infrared light chip 30*a* and the visible light chip 30*b* are placed in the corresponding predetermined position respectively and in contact with the fixing adhesive so as to form the preassembled part;

The said preassembled part is baked and cured so that the said infrared light chip 30*a* and the said visible light chip 30*b* are fixed on the said parallel support 10 or the said pin 20 after the said fixing adhesive is cured.

In other words, in the first step, dispense the fixing adhesive at the predetermined positions. Apply a layer of fixing adhesive to the predetermined positions on the parallel support 10. The predetermined positions are defined in advance, and the infrared light chip 30*a* and the visible light chip 30*b* will be placed at these positions; for example, the chip is fixed on the pin 20 of the sealing cavity P10; because the position of the pin 20 is fixed, the position of the chip is also fixed, and the position of a pin 20 can be selected for each chip. The fixing adhesive is usually an adhesive with strong viscosity, and used to firmly bond the chip to the support.

In the second step, place the infrared light chip 30*a* and the visible light chip 30*b*. The infrared light chip 30*a* and the visible light chip 30*b* are placed at the predetermined positions respectively and in contact with the positions coated with the fixing adhesive. The infrared light chip 30*a* and the visible light chip 30*b* are two photoelectric components in different ranges of wavelength respectively, and used to emit infrared light and visible light. They are placed at different positions on the support to ensure that the pins 20 can be connected correctly in subsequent steps and form the electrical circuits independent with each other. After the infrared light chip 30*a* and the visible light chip 30*b* are in contact with the fixing adhesive, a combination called preassembled part is formed. Due to the viscosity of the fixing adhesive, the light chips can be firmly attached to the parallel support 10.

In the third step, the preassembled part is baked and cured to cure the fixing adhesive and firmly fix the infrared light chip 30*a* and the visible light chip 30*b* on the parallel support 10. During the process of curing, the preassembled part is placed in special baking equipment, and baked according to the temperature and time parameters provided by the equipment. The temperature and time parameters during the process of baking will vary according to the material of the fixing adhesive used, so as to ensure the curing effect.

Preferably, the preassembled part shall be baked at the temperature of 150~180° C., and for 60~80 minutes. By these steps, the infrared light chip 30*a* and the visible light chip 30*b* can be fixed in the scaling cavity P10 of the parallel support 10. The process of baking and curing ensures the firmness of the fixing adhesive, so that the light chip can stay on the parallel support 10 stably. The above baking temperature, baking time and other parameters are used for curing of the fixing adhesive, in order to ensure that the infrared light chip 30*a* and the visible light chip 30*b* can be firmly attached to the parallel support 10. At the temperature of 150~180° C., sufficient heat is provided to promote the curing reaction of the fixing adhesive. The baking time is 60 to 80 minutes, which is long enough to ensure that the fixing adhesive is fully cured. The duration of baking can also be adjusted depending on the specific material and manufacturing process of the fixing adhesive.

As mentioned above, in the steps of packaging, the use of packaging adhesive or fluorescent adhesive mainly depends on the integrated functional requirements of the photodiode; for different light emitting requirements, the corresponding packaging adhesive or fluorescent adhesive shall be used to package the infrared light chip 30*a* and the visible light chip 30*b*. The explanation is made with several examples below.

First Example: The Photodiode is of the Light-Emitting Structure Integrating Infrared Light and Monochromatic Light Correspondingly, the process that the said infrared light chip 30*a* and the said visible light chip 30*b* are packaged with the packaging adhesive and/or the fluorescent adhesive to form the photodiode is particularized in that the infrared light chip 30*a* and the visible light chip 30*b* are packaged by dispensing transparent or translucent adhesive.

Specifically, in this example, both the infrared light chip 30*a* and the visible light chip 30*b* are packaged by dispensing transparent or translucent adhesive. This means that during the packaging process of the infrared light chip 30*a* and the visible light chip 30*b*, a kind of transparent or translucent packaging adhesive is used. The packaging adhesive may be made of epoxy, silicone or other applicable material.

During the packaging process, the infrared light chip 30*a* and the visible light chip 30*b* are placed at the predetermined positions respectively, and the transparent or translucent packaging adhesive is dispensed on the chips. These adhesive points will fix and protect the chips. When the packaging adhesive is cured, the infrared light chip 30*a* and the visible light chip 30*b* are firmly fixed on the parallel support 10 or the pin 20 to form the integrated photodiode.

In addition, in this example, the photodiode may include an infrared light chip 30*a* and a blue light chip. The infrared light chip 30*a* is used to emit infrared light and maintains stable with the protection of transparent or translucent adhesive. The visible light chip 30*b* is a blue light chip used to emit monochromatic light, such as blue light. The two chips are packaged separately and fixed with transparent or translucent adhesive during the packaging process.

By this integration method, the photodiode can emit both infrared light and blue light simultaneously, and has stable performance with the protection of the packaging adhesive.

Second Example: The Photodiode is of the Light-Emitting Structure Integrating the Infrared Light and the Red, Green and Blue Magic Light Correspondingly, the process that the said infrared light chip 30*a* and the said visible light chip 30*b* are packaged with the packaging adhesive and/or the fluorescent adhesive to form the photodiode is particularized in that the infrared light chip 30*a* and the visible light chip 30*b* are packaged by dispensing transparent or translucent adhesive. In this example, the photodiode may include an infrared light chip 30*a*, a red light chip, a green light chip, and a blue light chip.

In this example, the infrared light chip 30*a* and the visible light chip 30*b* are still packaged by dispensing transparent or translucent adhesive. The packaging adhesive may be made of epoxy, silicone or other applicable material.

Similar to the first example above, during the packaging process, the infrared light chip 30*a*, the red light chip, the green light chip and the blue light chip are placed at the predetermined position respectively, and transparent or translucent packaging adhesive is dispensed at these positions. Preferably, it is allowed to fill in the packaging cavity P10 of the parallel support 10 directly with transparent or translucent adhesive for packaging. When the packaging adhesive is cured, the infrared light chip 30*a* and the visible light chip 30*b* are firmly fixed on the parallel support 10 or the pin 20 to form the integrated photodiode.

In addition, in this example, the photodiode may include an infrared light chip 30*a*, a red light chip, a green light chip, and a blue light chip. The infrared light chip 30*a* is used to emit infrared light, while the red, green and blue light chips are used to emit red, green and blue magic light, respectively. These chips are packaged separately, and fixed with transparent or translucent adhesive during the packaging process.

By this integrating method, the photodiode can emit infrared light and red, green and blue magic light simultaneously, and has stable performance with the protection of the packaging adhesive.

Third Example: The Photodiode is of the Light-Emitting Structure Integrating Infrared Light and White Light Correspondingly, the process that the said infrared light chip 30*a* and the said visible light chip 30*b* are packaged with the packaging adhesive and/or the fluorescent adhesive to form the photodiode is particularized in that the said infrared light chip 30*a* is packaged by dispensing transparent or translucent adhesive, and the said visible light chip 30*b* is packaged by dispensing white light fluorescent adhesive. In this example, the photodiode may include an infrared light chip 30*a* and a blue light chip.

In this example, on the one hand, the infrared light chip 30*a* is packaged by dispensing transparent or translucent adhesive. The packaging adhesive may be made of epoxy, silicone or other applicable materials. The infrared light chip 30*a* is placed at the predetermined position, and the transparent or translucent packaging adhesive is dispensed at the position to fix and protect the chip. On the other hand, the visible light chip 30*b* is packaged by dispensing white light fluorescent adhesive. White light fluorescent adhesive is a special kind of fluorescent adhesive, with the ability to emit white light. During the packaging process, the visible light chip 30*b* is placed at the predetermined position, and the white light fluorescent adhesive is dispensed at the position. This fluorescent adhesive can protect the visible light chip 30*b* and provide the light-emitting effect of white light.

In addition, in this example, the photodiode may include an infrared light chip 30*a* and a blue light chip. The infrared light chip 30*a* is used to emit infrared light and maintains stable with the protection of transparent or translucent adhesive. The blue chip is used to emit blue light, and presents a white light effect with the protection of white fluorescent adhesive. Such two chips are packaged separately and fixed with transparent or translucent adhesive and white light fluorescent adhesive during the packaging process.

By this integrating method, the photodiode can emit infrared light and white light simultaneously, and has stable performance with the protection of the packaging adhesive.

Fourth Example: The Photodiode is of the Light-Emitting Structure Integrating Infrared Light and Composite Color Light Correspondingly, the process that the said infrared light chip 30*a* and the said visible light chip 30*b* are packaged with the packaging adhesive and/or the fluorescent adhesive to form the photodiode is particularized in that the said infrared light chip 30*a* is packaged by dispensing transparent or translucent adhesive, and the said visible light chip 30*b* is packaged by dispensing composite color light fluorescent adhesive. In this example, the photodiode may include an infrared light chip 30*a* and a blue light chip.

In this example, on the one hand, the infrared light chip 30*a* is packaged by dispensing transparent or translucent adhesive. The packaging adhesive may be made of epoxy, silicone or other applicable materials. The infrared light chip 30*a* is placed at the predetermined position, and the transparent or translucent packaging adhesive is dispensed at the position to fix and protect the chip. On the other hand, the visible light chip 30*b* is packaged by dispensing the composite color fluorescent adhesive. The composite color fluorescent adhesive is a special kind of fluorescent adhesive that can emit the light with a variety of colors. During the packaging process, the visible light chip 30*b* is placed at the predetermined position, and the composite color fluorescent adhesive is dispensed at the position. This fluorescent adhesive can protect the visible light chip 30*b* and provide colorful light emission effect.

In addition, in this example, the photodiode includes an infrared light chip 30*a* and a blue light chip. The infrared light chip 30*a* is used to emit infrared light and maintains stable with the protection of transparent or translucent adhesive. The blue light chip is used to emit blue light, and presents colorful light effect with the protection of composite color fluorescent adhesive. Such two chips are packaged separately and fixed with transparent or semi-transparent adhesive and the composite color fluorescent adhesive during the packaging process.

Different from the second example above, in this example, a visible light chip 30*b* is combined with the composite color fluorescent adhesive to achieve the composite color light effect.

By this integrating method, the photodiode can emit infrared light and composite color light simultaneously, and has stable performance with the protection of the packaging adhesive.

Fifth Example: The Photodiode is of the Light-Emitting Structure Integrating Infrared Light and White Light or Composite Color Light Correspondingly, the process that the said infrared light chip 30*a* and the said visible light chip 30*b* are packaged with the packaging adhesive and/or the fluorescent adhesive to form the photodiode is particularized in that the said infrared light chip 30*a* and the said visible light chip 30*b* are packaged by dispensing white light fluorescent adhesive or composite color light fluorescent adhesive. In this example, the photodiode includes an infrared light chip 30*a* and a blue light chip.

In this example, both the infrared light chip 30*a* and the visible light chip 30*b* are packaged by dispensing white light fluorescent adhesive or composite color fluorescent adhesive. The white light fluorescent adhesive can emit white light, and the composite color light fluorescent glue can emit composite color light effect. During the packaging process, the infrared light chip 30*a* and the visible light chip 30*b* are placed at the predetermined position respectively, and the white light fluorescent adhesive or the composite color fluorescent adhesive is dispensed at the corresponding position. The fluorescent adhesive can protect the chip and provide the emission effect of white light or composite color light.

In addition, in this example, the photodiode includes an infrared light chip 30*a* and a blue light chip. The infrared light chip 30*a* is used to emit infrared light, while the blue light chip is used to emit blue light. Such two chips are packaged separately, and the white light fluorescent adhesive or the composite color fluorescent adhesive is used to fix and achieve the light emitting effect during the packaging process.

Different from the third and fourth examples above, all chips in this example are packaged with white fluorescent adhesive or composite color fluorescent adhesive. In the third and fourth examples mentioned above, the infrared light chip 30*a* is packaged with packaging adhesive, while the visible light chip 30*b* is packaged with the fluorescent adhesive.

By this integrating method, the photodiode can emit infrared light, white light or composite color light simultaneously, and has stable performance with the protection of the packaging adhesive.

In some embodiments of the present invention, in the above step S105, the packaged photodiode is backed and cured, specifically:

The packaged photodiode is baked in the first stage. The baking temperature in the said first stage is 60~100° C., and the baking time is 60~80 minutes. This temperature range is selected as the temperature at which the packaging adhesive and the fluorescent adhesive are cured and dried gradually. During this baking process, the solvent or volatile components in the packaging adhesive and the fluorescent adhesive will evaporate gradually, making the colloidal material stronger and bound to the photodiode chip tightly.

The packaged photodiode is baked in the second stage. The baking temperature in the said first stage is 140~160° C., and the baking time is 60~80 minutes. A higher temperature is helpful to further cure and reinforce the packaging adhesive and the fluorescent adhesive to ensure their adhesion with the photodiode chip and stability. This baking process is also helpful to improve the heat and weather resistance of the packaging adhesive and the fluorescent adhesive, so as to adapt to various working environments and conditions.

By baking and curing in such two stages, the packaging adhesive and the fluorescent adhesive of the packaged photodiode can achieve the curing and stabilizing effect as required, so as to ensure that the photodiode has good performance, reliability and durability during the service life.

The embodiments of the present invention also provide an integrated photodiode, which is manufactured by the above method. The integrated photodiode can realize the functions of decoration, lighting and optical signal transmission, so it is widely used.

The embodiments of the present invention provide a photoelectric keyboard the LED key module, each said LED key module has the integrated photodiode as described above. Exemplarily, the photoelectric keyboard can switch over between infrared light and visible light with a switch.

With the photoelectric keyboard provided in the embodiments of the present invention, the integrated photodiode is applied to realize the functions of photoelectric lighting and optical signal transmission simultaneously, so as to reduce the amount of components, reduce the design size of the circuit board, reduce the difficulty of the process in application of the finished product, save the production cost, and realize mass production. In addition, the integrated photodiode in the present invention has the advantages of low power consumption, good stability, safety, environmental protection, energy saving, and is harmless to human body.

In the description of this Specification, the description with the terms such as “an embodiment”, “some embodiments”, “examples”, “specific examples”, or “some examples” means that the specific features, structures, materials, or characteristics described on the basis of such embodiments or examples are included in at least one embodiment or example of the present invention. In this Specification, the schematic representations of the above terms must not be directed to the same embodiments or examples. Furthermore, the specific features, structures, materials or characteristics so described may be combined in a suitable manner in any one or more embodiments or examples. In addition, without the conflict with each other, the persons skilled in the art may incorporate and combine the different embodiments or examples described in this Specification and the characteristics of different embodiments or examples.

Only the preferred embodiments of the present invention are described above without limitation on the claims of the present invention. All equivalent structure transformations made under the inventive concept of the present invention and with the contents of the Specification and the appended drawings of the present invention, or the direct/indirect application thereof in other related technical fields are included within the scope of patent protection of the present invention.

The invention claimed is:

1. A manufacturing method for an integrated photodiode, characterized by:

providing a parallel support having a plurality of pins;

fixing an infrared light chip and a visible light chip on the parallel support;

connecting electrodes of the infrared light chip and the visible light chip to corresponding pins to form electrical circuits independently with each other;

packaging the infrared light chip by dispensing a transparent or translucent adhesive, and packaging the visible light chip by dispensing a composite color light fluorescent adhesive to form a photodiode of a light-emitting structure integrating infrared light and composite color light; the transparent or translucent adhesive is a packaging adhesive, and the composite color light fluorescent adhesive is a photoluminescence fluorescent material adaptable to a color of the visible light chip;

baking and curing the packaged photodiode to form the photodiode integrating infrared light and visible light.

2. A manufacturing method for an integrated photodiode, comprising:

providing a parallel support having a plurality of pins;

fixing an infrared light chip and a visible light chip on the parallel support;

connecting electrodes of the infrared light chip and the visible light chip to corresponding pins to form electrical circuits independently with each other;

packaging the infrared light chip and the visible light chip by dispensing a white light fluorescent adhesive or a composite color light fluorescent adhesive to form a photodiode of a light-emitting structure integrating infrared light and white light of composite color light;

wherein the white light fluorescent adhesive or composite color light fluorescent adhesive is a photoluminescence fluorescent material adaptable to a color of the visible light chip; and baking and curing the packaged photodiode to form the photodiode integrating infrared light and visible light.

* * * * *